(12) United States Patent
Kojima et al.

(10) Patent No.: US 6,344,307 B1
(45) Date of Patent: Feb. 5, 2002

(54) PHOTOSENSITIVE RESIN COMPOSITION

(75) Inventors: Daisuke Kojima, Hiratsuka; Osamu Isozaki, Yokohama; Hideo Kogure, Atsugi; Genji Imai, Hiratsuka, all of (JP)

(73) Assignee: Kansai Paint Co., Ltd., Hyogo (JP)

( * ) Notice: Subject to any disclaimer, the term of this patent is extended or adjusted under 35 U.S.C. 154(b) by 0 days.

(21) Appl. No.: 09/673,316

(22) PCT Filed: Apr. 16, 1999

(86) PCT No.: PCT/JP99/02026

§ 371 Date: Oct. 13, 2000

§ 102(e) Date: Oct. 13, 2000

(87) PCT Pub. No.: WO99/54788

PCT Pub. Date: Oct. 28, 1999

(30) Foreign Application Priority Data

Apr. 17, 1998 (JP) ............................................. 10-107628
Apr. 17, 1998 (JP) ............................................. 10-107629

(51) Int. Cl.$^7$ ............................................. G03F 7/027
(52) U.S. Cl. .................. 430/288.1; 430/281.1; 522/31
(58) Field of Search .................. 430/281.1, 288.1; 522/31

(56) References Cited

U.S. PATENT DOCUMENTS 5,496,678 A * 3/1996 Imai et al. ............... 430/176
5,591,562 A * 1/1997 Komatsu et al. ......... 430/280.1

FOREIGN PATENT DOCUMENTS

| JP | 5-100429 | 4/1993 |
| JP | 6-161110 | 6/1994 |
| JP | 6-313136 | 11/1994 |
| JP | 7-146552 | 6/1995 |
| JP | 7-146557 | 6/1995 |
| JP | 10-73923 | 3/1998 |

* cited by examiner

*Primary Examiner*—Rosemary Ashton
(74) *Attorney, Agent, or Firm*—Armstrong, Westerman, Hattori, McLeland & Naughton, LLP

(57) ABSTRACT

A photosensitive resin composition characterized by comprising (A) a resin having at least one aprotic onium salt represented by the general formula:

$$—COO^-·W^+ \quad (1)$$

and/or the general formula:

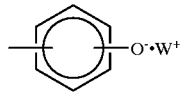

$—O^-·W^+$ (2)

(in each of the above general formulas, W$^+$ represents

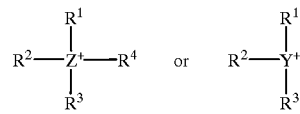

wherein, Z represents a nitrogen atom or phosphorus atom; Y represents a sulfur atom; $R^1$, $R^2$, $R^3$ and $R^4$ each represents an organic group having 1 to 30 carbon atoms), (B) a compound having two or more vinylether groups in a molecule and (C) a compound which generates an acid upon irradiation with actinic energy rays.

6 Claims, No Drawings

PHOTOSENSITIVE RESIN COMPOSITION

TECHNICAL FIELD

The present invention relates to a novel photosensitive resin composition.

BACKGROUND ART

Photoresist for forming a pattern image by photography is widely used in the field of manufacturing printed circuit boards. Especially, an aqueous photoresist developable with a dilute alkaline solution is less problematic, as compared to a photoresist developable with an organic solvent, from the viewpoints of toxicity to human body, environmental pollution, fire risk and the like. As such aqueous photoresist, there has been known, for example, an aqueous photosensitive resin composition comprising a protic ammonium salt-containing resin obtained by neutralizing a carboxyl group-containing resin with a basic compound such as tertiary amine, a compound having two or more vinylether groups in a molecule and a compound which generates an acid upon irradiation with actinic energy rays (Japanese Unexamined Patent Publication No. 313134/1994).

The resin composition functions as a positive photoresist by such a mechanism that, by heating a coating film of the resin composition, the coating film is cured by crosslinking by an addition reaction of a carboxyl group and a vinylether group, so that the coating film becomes insoluble to an organic solvent or an alkaline solution, and then the coating film is irradiated with actinic energy rays and subsequently heated, so that the crosslinked structure in the coating film are broken by a catalytic action of an acid generated upon irradiation, thereby the irradiated areas become soluble to the organic solvent or the alkaline solution.

However, the above composition has a problem that the composition fails to form a pattern image excellent in resolution, since the acid generated by the irradiation with the actinic energy rays is trapped by a basic compound contained in the coating film to result in an insufficient breakage of the crosslinked structure in the coating film, so that the irradiated areas cannot be removed sufficiently by the organic solvent or the alkaline solution. Such problem is considered attributable to the use of the protic ammonium salt-containing resin, i.e., in the case of using the protic ammonium salt-containing resin for forming a coating film, the basic compound used for neutralization of the resin is regenerated upon heating the coating film and traps the acid generating upon irradiation with actinic energy rays to cause the problem.

DISCLOSURE OF INVENTION

An object of the present invention is to provide a novel photosensitive resin composition which can overcome the problem of the conventional techniques.

Another object of the present invention is to provide a novel photosensitive resin composition capable of forming a pattern image excellent in resolution as a positive photoresist.

Other objects and features of the present invention will become apparent from the following description.

The present invention provides a photosensitive resin composition characterized by comprising (A) a resin having at least one aprotic onium salt represented by the general formula:

$$-COO^- \cdot W^+ \quad (1)$$ 

and/or the general formula:

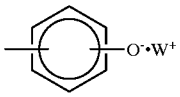

(2)

{in each of the above general formulas, W⁺ represents

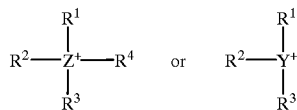

wherein, Z represents a nitrogen atom or a phosphorus atom; Y represents a sulfur atom; $R^1$, $R^2$, $R^3$ and $R^4$ are the same or different and each represents an organic group having 1 to 30 carbon atoms; $R^1$ and $R^2$ or $R^1$, $R^2$ and $R^3$ may combine to form a heterocyclic ring together with the nitrogen atom, phosphorus atom or sulfur atom to which they are bound; and any one of $R^1$ to $R^4$ may be a group represented by the general formula:

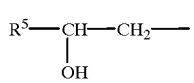

(3)

(wherein, $R^5$ is a hydrocarbon group having 1 to 28 carbon atoms which may optionally be substituted by a hydroxyl group, an alkoxy group, an ester group or a halogen atom, or a hydrogen atom)}, (B) a compound having two or more vinylether groups in a molecule, and (C) a compound which generates an acid upon irradiation with actinic energy rays.

The inventors have carried out an extensive research to solve the above problem of the prior art and found that it is possible to solve the problem by the use of the above specific aprotic onium salt-containing resin. Based on the findings, the present invention has been accomplished.

When a coating film of the composition of the invention is heated to cure, the onium base W⁺ contained in the aprotic onium salt-containing resin (A) is thermally decomposed via the Hoffman degradation or the like to be released from the resin skeleton and volatilized. Therefore, the acid generated by the irradiation with actinic energy rays is never trapped in the cured coating film since no basic compound exists therein. Consequently, the crosslinked structure in the cured coating film is efficiently broken, to thereby achieve a pattern image excellent in resolution.

The composition of the invention is designed to achieve a pattern image excellent in resolution as a positive photoresist in such a manner that the composition coated on a printed board is heated to be cured by crosslinking, followed by subjecting the cured coating film to irradiation with actinic energy rays to generate an acid which breaks crosslinks in areas exposed to the irradiation, thereby making only the exposed areas to be soluble to a developing solution and removed.

Components of the composition of the invention are described in detail in the following.

(A) Aprotic Onium Salt-Containing Resin

The resin (A) comprised in the photosensitive resin composition of the invention has at least one aprotic onium salt represented by the general formula (1) and/or the general formula (2).

The organic groups having 1 to 30 carbon atoms represented by $R^1$, $R^2$, $R^3$ and $R^4$ in the general formulas (1) and (2) are not limited insofar as they do not substantially inhibit ionization of an ammonium base, a phosphonium base or a sulfonium base, and, for example, hydrocarbon groups having 1 to 30 carbon atoms which may contain a heteroatom such as an oxygen atom in the form of a hydroxyl group, an alkoxy group and so on are typically used as the organic groups.

Examples of the hydrocarbon groups are aliphatic, alicyclic or aromatic hydrocarbon groups such as an alkyl group, a cycloalkyl group, a cycloalkylalkyl group, an aryl group and an aralkyl group.

The alkyl group may be a straight- or branched-chain group having 8 or less carbon atoms, preferably lower groups; examples of which include methyl, ethyl, n-propyl, iso-propyl, n-butyl, iso-butyl, sec-butyl, tert-butyl, pentyl, heptyl and octyl groups, etc.

The cycloalkyl group or the cycloalkylalkyl group may preferably be those having 5 to 8 carbon atoms; examples of which include cyclopentyl, cyclohexyl, cyclohexylmethyl and cyclohexylethyl groups, etc. Phenyl, toluyl and xylyl groups or the like may suitably be used as the aryl group, and a benzyl group or the like may suitably be used as the aralkyl group.

Further, preferred examples of the hydrocarbon group containing the heteroatom such as an oxygen atom include a hydroxyalkyl group (especially a hydroxy-lower-alkyl group), specifically a hydroxymethyl, hydroxyethyl, hydroxybutyl, hydroxypropyl, hydroxypentyl, hydroxyheptyl and hydroxyoctyl groups, etc. and alkoxyalkyl group (especially a lower-alkoxy-lower-alkyl group), specifically a methoxymethyl, ethoxymethyl, ethoxyethyl, propoxymethyl, propoxyethyl, butoxymethyl and butoxyethyl groups, etc.

In the general formulas (1) and (2), $R^5$ is a hydrocarbon group having 1 to 28 carbon atoms which may optionally be substituted by a hydroxy group, an alkoxy group, an ester group or a halogen atom, or a hydrogen atom. Examples of a hydrocarbon group which is not substituted include an aliphatic, alicyclic or aromatic hydrocarbons such as an alkyl group, an alkenyl group, a cycloalkyl group, a cycloalkylalkyl group, an aryl group and an aralkyl group.

Among above hydrocarbon groups, the alkyl group and the alkenyl group are preferred and these may be straight- or branched-chain groups; examples of which include a methyl, ethyl, propyl, butyl, pentyl, heptyl, octyl, vinyl, 1-methylvinyl, lauryl and stearyl groups, etc. Further, preferred examples of the cycloalkyl group or the cycloalkylalkyl group are those having 5 to 8 carbon atoms such as cyclopentyl, cyclohexyl, cyclohexylmethyl and cyclohexylethyl groups. Furthermore, a phenyl, toluyl and xylyl groups, etc. may suitably be used as the aryl group, and a benzyl group, etc. may suitably be used as the aralkyl group.

Preferred examples of the hydrocarbon group substituted by a hydroxyl group include a hydroxyalkyl group (especially a hydroxy-lower-alkyl group), specifically, hydroxymethyl, hydroxyethyl, hydroxyheptyl and hydroxyoctyl groups, etc.

Preferred examples of the hydrocarbon group substituted by an alkoxy group include an alkoxyalkyl group (especially a lower-alkoxy-lower-alkyl group), specifically, methoxymethyl, 2-ethylhexyloxymethyl, phenoxymethyl, 2-methyloctyloxymethyl, sec-butylphenoxymethyl, stearyloxymethyl, allyloxymethyl, ethoxyethyl, propoxyethyl, propoxymethyl, butoxymethyl and butoxyethyl groups, etc.

Preferred examples of the hydrocarbon group substituted by an ester group include various carboxylic acid alkyl groups. Specific examples thereof include acryloyloxymethyl, methacryloyloxymethyl, acetoxymethyl, benzoyloxymethyl and cyclohexylcarbonylmethyl groups, etc.

Preferred examples of the hydrocarbon group substituted by a halogen atom include chloromethyl, chloroethyl, bromomethyl, iodomethyl, dichloromethyl, trichloromethyl, chloroethyl and chlorobutyl groups, etc.

Specific examples of $W^+$, which is an aprotic onium base, having no heterocyclic ring are given below.

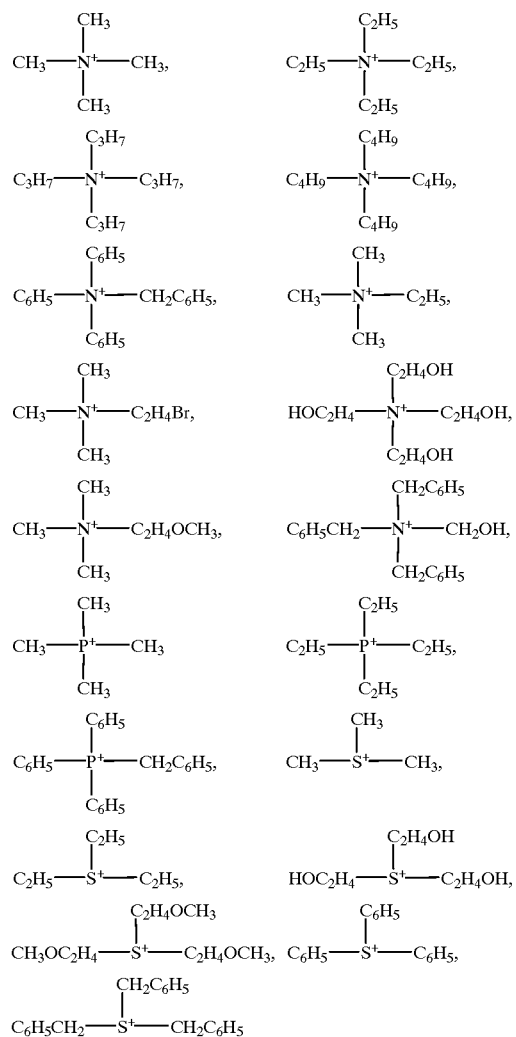

Further, examples of $W^+$ wherein $R^1$ and $R^2$ or $R^1$, $R^2$ and $R^3$ combine to form a heterocyclic group together with the nitrogen atom, phosphorus atom or sulfur atom to which they are bound are given below.

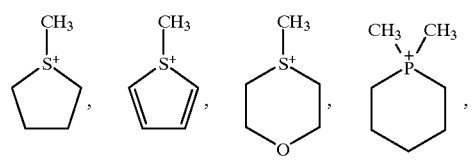

-continued

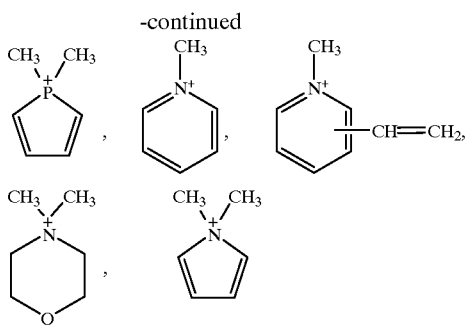

Further, W⁺ having a group represented by the general formula (3) are those wherein a carbon atom at β position from the nitrogen atom, phosphorus atom or sulfur atom of the onium base has a secondary hydroxyl group. Examples of such W⁺ are represented by the formulas given below.

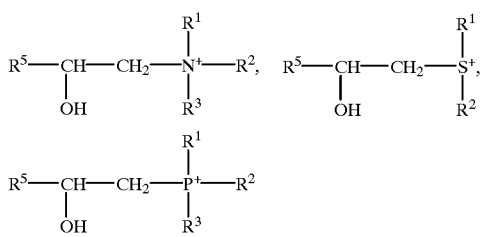

(in each of the formulas, $R^1$, $R^2$, $R^3$ and $R^5$ are the same as described above).

As the aprotic onium salt-containing resin (A), a resin containing 0.1 to 5 mol of the aprotic onium salt represented by the general formula (1) and/or the aprotic onium salt represented by the general formula (2) per 1 kilogram of the resin may preferably be used. In the case of using the resin for preparing a photoresist, when a content of the aprotic onium salt is less than 0.1 mol/kg, it will undesirably be difficult to remove exposed areas of the coating film, while when the content exceeds 5 mol/kg, unexposed areas of the coating film will undesirably be deteriorated in adhesiveness. Thus, contents outside said range are not preferable. More preferably, the content is in the range of about 0.2 to 4 mol/kg.

Acid value of the resin (A) may preferably be about 10 to 500 mgKOH/g, more preferably about 20 to 400 mgKOH/g. Weight average molecular weight of the resin (A) may preferably be about 500 to 200,000, more preferably be about 1,000 to 100,000.

The aprotic onium salt-containing resin (A) is prepared by introducing an aprotic onium salt to a starting resin such as a carboxyl group-containing resin, a hydroxyphenyl group-containing resin or a carboxyl group and hydroxyphenyl group-containing resin.

As the starting resin, in the case of using the carboxyl group-containing resin, the salt of the general formula (1) is introduced thereto; in the case of using the hydroxyphenyl group-containing resin, the salt of the general formula (2) is introduced thereto; and in the case of using the carboxyl group and hydroxyphenyl group-containing resin, the salts of the general formulas (1) and (2) are introduced thereto.

Examples of the carboxyl group-containing resin are a copolymer of carboxyl group- or carboxylic acid anhydride group-containing unsaturated monomer; carboxyl group-containing polyester; carboxyl group-containing polyamide; carboxyl group-containing polyimide; carboxyl group-containing polyurethane (e.g., polyurethane prepared by using dihydroxypropionic acid or the like as a starting material and introducing thereto a carboxyl group); a maleic acid adduct of butadiene copolymers; an adduct of a hydroxyl group-containing resin and a carboxylic acid anhydride; etc.

Examples of the hydroxyphenyl group-containing resin are a condensation product of a monofunctional or polyfunctional phenol compound, alkylphenol compound or a mixture thereof and a carbonyl compound such as formaldehyde and acetone; a homopolymer of a hydroxyl group-containing vinyl aromatic compound such as p-hydroxystyrene; a copolymer of the hydroxyl group-containing vinyl aromatic compound and other copolymerizable monomers; etc.

Examples of the carboxyl group and hydroxyphenyl group-containing resin are a copolymer of hydroxystyrene such as p-hydroxystyrene and a carboxyl group-containing polymerizable unsaturated monomer; a copolymer of hydroxystyrene, carboxyl group-containing polymerizable unsaturated monomer and other copolymerizable monomers; etc.

The starting resin may suitably contain a carboxyl group, a hydroxyphenyl group or both of the groups in an amount of preferably 0.2 to 16 mol/kg, more preferably 0.4 to 14 mol/kg. If the content is less than 0.2 mol/kg, the resulting composition tends to be less developable with the organic solvent or diluted alkaline aqueous solution. Moreover, if the content exceeds 16 mol/kg, the composition is decreased in its solvent resistance, chemical resistance and the like after heating and crosslinking, thereby the composition is decreased in the performance when used as a solder resist or a plating resist.

Further, the starting resin may preferably have a weight average molecular weight of about 500 to 200,000, more preferably about 1,000 to 100,000. Furthermore, acid value of the starting resin may preferably be about 20 to 600 mgKOH/g, more preferably about 30 to 500 mgKOH/g.

As a method for introducing an aprotic onium salt to a starting resin having carboxyl group and/or hydroxyphenyl group to prepare the aprotic onium salt-containing resin (A), there may be employed a method (I) of introducing an onium salt directly to a starting resin or a method (II) of mixing a starting resin with an onium salt compound separately prepared.

In the method (I) for introducing an onium salt directly to a starting resin, tertiary amine, phosphine or thioether and an epoxy compound are reacted with the resin simultaneously.

In the case of using the carboxyl group-containing resin as the starting resin and reacting it with tertiary amine and epoxy compound, the reaction is represented by the following reaction formula:

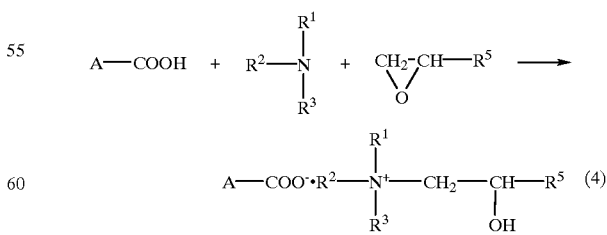

(wherein, A represents a resin skeleton of the resin; $R^1$, $R^2$, $R^3$ and $R^5$ are the same as described above).

When phosphine is used in lieu of tertiary amine, the reaction formula is the same as the reaction formula (4)

except for replacing N with P; and, when thioether is used in lieu of tertiary amine, the reaction formula is the same as the reaction formula (4) except for replacing N with S and deleting $R^3$. Further, when hydroxyphenyl group-containing resin or carboxyl group and hydroxyphenyl group-containing resin is used as a starting resin, the reaction is the same as the reaction formula (4) shown above except for exchanging the starting resin.

The reaction of the reaction formula (4) is carried out at a temperature of about 10 to 150° C. and is complete in about 1 to 30 hours.

Representative examples of tertiary amine include trimethylamine, triethylamine, methyldibenzylamine and like alkylamines; dimethylethanolamine, methylethanolamine, triethanolamine and like alkanolamines; pyridine, methylpyridine, dimethylpyridine and like pyridines; morpholines; N,N-dimethylaniline, N,N-diethanolaniline, N,N-2-hydroxypropanolaniline and like anilines and so forth.

Representative examples of the epoxy compound include 2,3-epoxy-1-propanol, ethyleneoxide, propyleneoxide, 1,2-butyleneoxide, 1,2-pentyleneoxide, glycidyl(meth)acrylate and like aliphatic epoxy compounds; styreneoxide, glycidylphenyl and like aromatic epoxy compounds and so forth.

The reaction of the reaction formula (4) may be carried out in the presence of water or an organic solvent. Usable organic solvents include, for example, ether-alcohol solvents such as ethyleneglycolmonobutylether, ethyleneglycolmonoethylether and propyleneglycolmonomethylether; ether solvents such as dioxane and ethyleneglycoldiethylether; alcohol solvents such as ethanol, propanol, butanol and benzyl alcohol; ketone solvents such as methylethylketone and methylisobutylketone; amide solvents such as N-methyl pyrrolidone, N,N-dimethyl acetoamide and N,N-dimethylformamide and the like.

The method (II) for mixing an aprotic onium salt compound separately prepared with a starting resin is described below by way of example.

Firstly, except for using organic carboxylic acid in lieu of the carboxyl group-containing resin, the reaction is carried out in the same manner as of the reaction formula (4) to obtain an onium salt consisting of $W^+$ cation and —COO⁻ anion. Then, the onium salt is passed through an anion exchange resin to exchange the anion with a hydroxyl anion, thereby giving an aprotic onium salt compound represented by the general formula:

$$HO^- \cdot W^+ \qquad (5)$$

(wherein, $W^+$ is as described above).

Next, the onium salt compound represented by the general formula (5) is mixed with the starting resin to give the target aprotic onium salt-containing resin (A).

Examples of the organic carboxylic acid include formic acid, acetic acid, lactic acid, hydroxyacetic acid and the like.

Compound (B) Having 2 or More Vinylether Groups in a Molecule

As the compound (B) to be comprised in the photosensitive resin composition of the invention, for example, there may be suitably used a compound having 2 or more vinylether groups in a molecule, which is represented by the general formula:

$$—R—O—CH=CH_2 \qquad (6)$$

(wherein, R represents an alkylene group having 1 to 6 carbon atoms) may suitably be used. Preferably, the compound may have 2 to 4 vinylether groups in a molecule.

Examples of the alkylene group having 1 to 6 carbon atoms, which is represented by R, are an ethylene group, propylene group, butylene group and the like.

The compound (B) may be a low molecular weight compound or a high molecular weight compound, and examples of which include a condensation product of a polyphenol compound such as bisphenol A, bisphenol F, bisphenol S or phenol resin, or polyol such as ethyleneglycol, propyleneglycol, trimethylolpropane, trimethylolethane or pentaerythritol, and halogenized alkylvinylether such as chloroethylvinylether; a reaction product between a polyisocyanate compound such as tolylenediisocyanate, xylylenediisocyanate, hexamethylenediisocyanate or isophoronediisocyanate and hydroxyalkylvinylether such as hydroxyethylvinylether; and the like.

Compound (C) Which Generates an Acid Upon Irradiation With Actinic Energy Rays

The compound (C) to be comprised in the photosensitive resin composition may preferably be a compound which decomposes upon irradiation with the actinic energy rays which will be described later to generate an acid strong enough to break a crosslinked structure formed between the resin (A) and the compound (B).

Examples of the compound (C) include compounds represented by the following formulas (7) to (20).

Formula

$$Ar_2I^+ \cdot X^- \qquad (7)$$

(wherein, Ar represents an aryl group; and $X^-$ represent $PF_6^-$, $SbF_6^-$, or $AsF_6^-$). Examples of the aryl group are phenyl, toluyl and xylyl groups, etc.

Formula

$$Ar_3S^+ \cdot X^- \qquad (8)$$

(wherein, Ar and $X^-$ are the same as described above).

Formula (9)

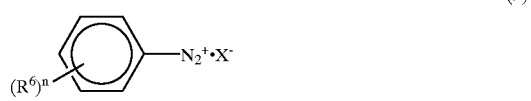

(wherein, $R^6$ represents an alkyl group having 1 to 12 carbon atoms or an alkoxy group having 1 to 12 carbon atoms; n represents an integer of 0 to 3; and $X^-$ is the same as described above). Examples of the alkyl group having 1 to 12 carbon atoms are a methyl, ethyl, propyl, butyl, pentyl, hexyl and octyl groups, etc., and examples of the alkoxy group having 1 to 12 carbon atoms are a methoxy, ethoxy, propoxy, butoxy and hexyloxy groups, etc.

Formula (10)

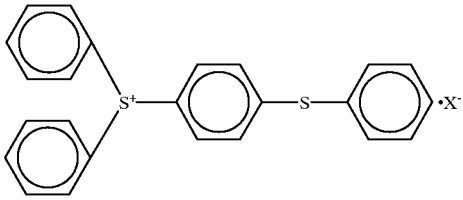

(wherein, X⁻ is the same as described above).

Formula (11)

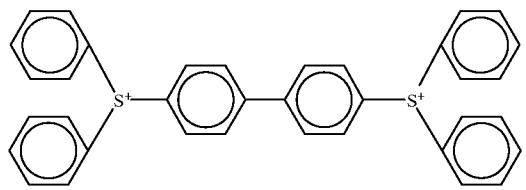

(wherein, X⁻ is the same as described above).

Formula (12)

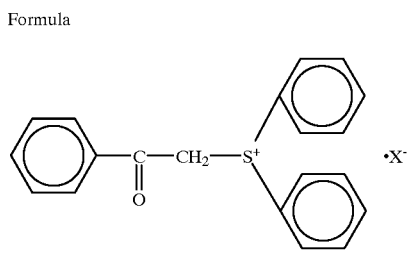

(wherein, X⁻ is the same as described above).

Formula (13)

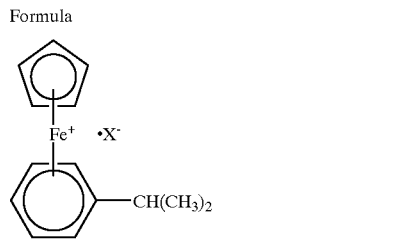

(wherein, X⁻ is the same as described above).

Formula (14)

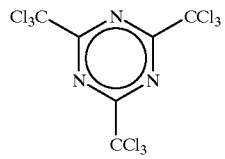

Formula (15)

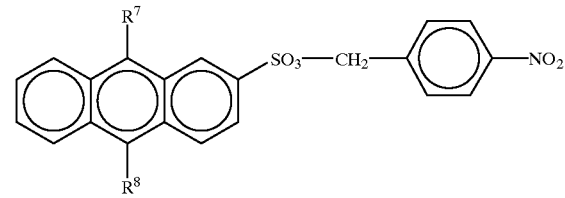

(wherein, $R^7$ and $R^8$ are the same or different and respectively represents an alkyl group having 1 to 12 carbon atoms or an alkoxy group having 1 to 12 carbon atoms). The alkyl group having 1 to 12 carbon atoms and the alkoxy group having 1 to 12 carbon atoms are as described above.

Formula (16)

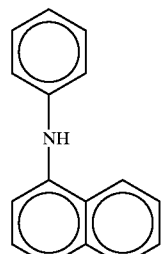

Formula (17)

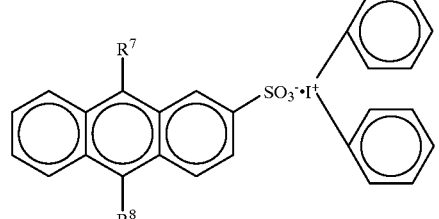

(wherein, $R^7$ and $R^8$ are the same as described above).

Formula (18)

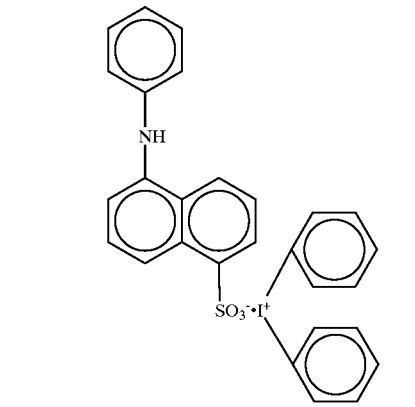

Formula (19)

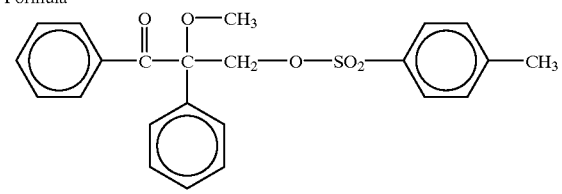

Formula

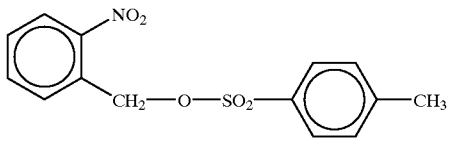
(20)

Preferably, the aprotic onium salt-containing resin (A), the compound (B) having 2 or more vinylether groups in a molecule and the compound (C) which generates an acid upon irradiation with actinic energy rays, which are the essential components of the photosensitive resin composition of the invention, may be mixed in the following proportions.

That is, the photosensitive resin composition of the invention may suitably comprise, per 100 parts by weight of the resin (A), the compound (B) in an amount ranging typically from about 5 to 150 parts by weight, preferably from about 10 to 100 parts by weight and the compound (C) in an amount ranging typically from about 0.1 to 40 parts by weight, preferably from about 0.2 to 20 parts by weight.

A photosensitizer may be added to the composition of the invention when so required. Examples of the photosensitizer are phenothiazines, anthracenes, coronenes, benzanthracenes, perillenes, merocyanines, ketocoumarins, fumarines, borates and the like.

When using the photosensitizer, an amount of the photosensitizer to be comprised in the composition of the invention may preferably be in the range of, per 100 parts by weight of the resin (A), about 0.1 to 10 parts by weight, in particular about 0.3 to 5 parts by weight.

The composition of the invention may further comprise a plasticizer, fluidity adjuster, dye, pigment and the like when so required.

The photosensitive resin composition of the invention can be used as it is after mixing the components without adding a solvent thereto.

Further, the composition of the invention can be used as an aqueous resin composition wherein the components are dissolved or dispersed in water, taking advantages of the onium salt in the aprotic onium salt-containing resin (A). In addition, the aqueous resin composition of the invention as it is can suitably be used as an electrocoating composition.

Furthermore, the composition of the invention can be used as an organic solvent-based resin composition by dissolving or dispersing the components in an organic solvent.

The photosensitive resin composition of the invention suitably functions as a positive photoresist in such a manner that the aprotic onium base $W^+$ in the component (A) is thermally decomposed when heating a coating film formed by using the photosensitive resin composition and released from the resin skeleton to regenerate a carboxyl group and/or a hydroxyphenyl group; the coating film is cured by crosslinking caused by addition reaction of the regenerated group or groups and vinylether groups in the component (B) to be insoluble to an organic solvent or an alkaline solution; and, upon irradiation with actinic energy rays, followed by heating when necessary, the crosslinked structure in the coating film is broken by the catalytic action of an acid generated from the component (C) to thereby make areas exposed to the irradiation to be soluble to the organic solvent or alkaline solution again.

Therefore, the composition of the invention can suitably be used as a positive photoresist. Moreover, the composition of the invention can also be used as a solder resist, plating resist, printing material or the like.

Formation of Pattern Image

Illustrated hereafter is one example of formation of a pattern image on a substrate such as a printed board by using the composition of the invention as a positive photoresist.

Firstly, the composition of the invention is applied on a substrate and cured to obtain a coating film of a photosensitive resin composition. Then, the coating film is subjected to an irradiation with actinic energy rays directly or through a pattern mask to obtain a desired resist film (image), followed by heating when necessary. After that, areas exposed to the irradiation are subjected to a developing treatment using an alkaline solution or an organic solvent to form the resist film on the substrate, and areas on the substrate which are not protected by the resist film are subjected to an etching. Then, a pattern image is formed upon removal of the resist film.

Examples of the substrate are a glass-epoxy board, a polyethyleneterephthalate film, a polyimide film and like electrically insulated plastic films or plastic boards; the plastic film or plastic board having a surface on which an electrically-conductive film is formed by adhesive bonding a metal foil of copper, aluminum or the like, or by bonding a metal such as copper, nickel, silver or the like or a compound such as an electrically-conductive oxide or the like including oxidized indium-tin (ITO) by means of vacuum deposition, chemical vapor deposition, plating or the like; a plastic board or a plastic film with a through hall on which is formed an electrically-conductive film including the through hall portion; and metal boards such as a copper board, etc.

A photosensitive resin composition coating film is formed by applying the photosensitive resin composition of the invention on the substrate by means of, for example, spray coating, electrostatic coating, spinning, dipping, roller coating, curtain flow coating, silk screen and the like, followed by setting, etc. when necessary, and curing by crosslinking at a temperature of about 50 to 130° C.

Further, when the aqueous photosensitive resin composition of the invention is used as an electrocoating composition, a positive photosensitive resin composition coating film can be formed by electrocoating the substrate with the aqueous composition by ordinary manner, followed by drying and air blowing, and curing the obtained coating film by crosslinking at a temperature ranging from about 50 to 200° C.

Thickness of the photosensitive composition coating film, as a cured coating film, may preferably be in the range of about 0.5 to 100 $\mu$m, in particular about 1 to 50 $\mu$m.

Type of the actinic energy rays to be irradiated is selected depending on the type of the compound (C) comprised in the composition of the invention. The actinic energy rays may preferably be electron beam, monochromatic rays having a wavelength of 200 to 600 nm or blended rays thereof. More specifically, ultraviolet rays generated by a high pressure mercury lamp, extra-high pressure mercury lamp, xenon lamp, metal halide lamp or like conventional lamps used for generating actinic rays such as ultraviolet rays, etc.; visible rays whose light source has a oscillation line at an emission spectrum wavelength of 488 nm (argon laser) or of 532 nm (YAG-SHG laser) or the like may be employed.

Subsequently, the coating film may be heated when necessary, and exposed areas thereof are subjected to a developing treatment using an aqueous alkaline solution. In the developing treatment, the exposed areas may typically be washed out by using an aqueous weak alkaline solution prepared by diluting with water sodium hydroxide, sodium carbonate, potassium hydroxide, ammonia, amine or the like.

Non-circuit areas (e.g. copper layer) on the developed substrate are removed by etching using an aqueous ferric chloride solution or an aqueous cupric chloride solution. Further, the resist film is removed by using a strong alkali such as sodium hydroxide or an organic solvent such as methylene chloride.

The pattern image thus formed has a very fine pattern and is excellent in contrast. Especially, since the unexposed areas of the resist film has a crosslinked structure, the unexposed areas are excellent in resistance against the developing solution and etching solution when compared to the conventional positive photoresist, thus to ensure an excellent precision of the pattern image.

BEST MODE FOR CARRYING OUT THE INVENTION

The following Preparation Examples, Examples and Comparative Examples will illustrate the present invention in further detail. As used herein, "parts" and "%" respectively mean "parts by weight" and "weight percent".

PREPARATION EXAMPLE 1 PREPARATION OF RESIN (A) FOR THE INVENTION

A mixture of 120 parts of ethylacrylate, 450 parts of methyl methacrylate, 300 parts of styrene, 130 parts of acrylic acid and 30 parts of α,α'-azobisisobutylonitrile was added dropwise in 3 hours to 637 parts of propylene glycol monomethylether which was retained at a temperature of 115° C., in a nitrogen gas atmosphere. After that, the resulting mixture was stirred at a temperature of 115° C. for 3 hours to give a carboxyl group-containing resin solution. The resin had an acid value of 100 mgKOH/g and a weight average molecular weight of 13,000 measured by GPC.

Subsequently, the resin solution (adjusted to have a solid content of 1,500 parts) was cooled to room temperature, and then 79.3 parts of thioglycol and 40.1 parts of glycidol were added thereto. The mixture was then stirred for 5 hours at a temperature of 60° C. to give an aprotic sulfonium salt-containing resin solution. The resin thus obtained had a sulfonium salt content of 0.3 mol/kg, an acid value of 80 mgKOH/g and a weight average molecular weight measured by GPC of about 14,000. This resin solution was capable of being diluted by water to an arbitrary concentration.

PREPARATION EXAMPLE 2 PREPARATION OF RESIN (A) FOR THE INVENTION

After cooling the carboxyl group-containing resin solution obtained as an intermediate product in Preparation Example 1 (adjusted to have a solid content of 1,500 parts) to room temperature, added thereto was 480 parts (as a solid content) of the following aprotic sulfonium salt compound. The mixture was dispersed in water with stirring, to thereby give an aqueous aprotic sulfonium salt-containing resin dispersion. This resin had a sulfonium salt content of 0.3 mol/kg, an acid value of 80 mgKOH/g and a weight average molecular weight of about 15,000 measured by GPC.

The above aprotic sulfonium salt compound corresponds to the aprotic onium salt compound of General Formula (5), which was obtained in the following manner. After dissolving 1.2 mol of thioglycol and 1.0 mol of glycidol to a mixed solvent of a deionized water and propylene glycol monomethylether, the mixture was heated so that the temperature is elevated to 60° C. To the mixture, 1.0 mol of acetic acid was added dropwise in 1 hour, followed by reaction at 60° C. for 6 hours, to give an aqueous solution of an aprotic sulfonium salt compound having an acetate anion. Then, the aqueous solution was passed through an anion exchange resin to exchange the acetate anion with a hydroxyl anion to give the aprotic sulfonium salt compound.

PREPARATION EXAMPLE 3 PREPARATION OF A RESIN FOR COMPARISON

The carboxyl group-containing resin solution obtained as an intermediate product in Preparation Example 1 (solid content thereof was adjusted to 1,000 parts) was cooled to room temperature, followed by adding 70 parts of triethylamine and stirring for 5 hours at a temperature of 60° C. to give a protic ammonium salt-containing resin solution.

In the following Examples and Comparative Examples, each of the resin solutions obtained in above Preparation Examples 1 to 3 was diluted with potable water to have a solid content of 60%.

EXAMPLE 1

A composition was obtained by mixing 167 parts (solid content of 100 parts) of the aprotic sulfonium salt-containing resin solution of Preparation Example 1 which had been diluted, 10 parts of a condensation product of 1 mol of bisphenol A and 2 mol of 2-chloroethylvinylether and 10 parts of a compound which generates an acid upon irradiation with actinic energy rays (Tradename: "NAI-105"; product of Midori Kagaku Kabushiki Kaisha). The composition was applied on a copper-clad laminate to form a coating film, followed by heating the coating film at 120° C. for 10 minutes to be cured by crosslinking (film thickness 5 μm). Then, a pattern mask was brought into close contact with the cured coating film surface and ultraviolet rays (200 mJ/cm) were irradiated thereon by using a extra high-pressure mercury-vapor lamp, and then the irradiated coating film was heated at a temperature of 120° C. for 10 minutes, followed by a developing treatment using a 0.75% sodium carbonate aqueous solution (at a temperature of 25° C.; immersed for 30 seconds). The satisfactory pattern of cured coating film was obtained, wherein exposed areas were completely eluted and free from a residual film and unexposed areas were free from a defect.

Next, after etching the copper of the exposed areas using a 1% ferric chloride aqueous solution, the cured coating film of the unexposed areas were removed by using a 3% sodium hydroxide aqueous solution, to thereby give a printed circuit board having a line width of 100 μm and a fine pattern image excellent in resolution.

EXAMPLE 2

Except for using the aprotic sulfonium salt-containing resin solution of the Preparation Example 2 in place of the aprotic sulfonium salt-containing resin solution of Preparation Example 1, preparation of a composition, formation of a cured coating film on a copper-clad laminate, pattern exposure, development, etching and removal of the cured coating film were carried out in the same manner as in Example 1. Like the results of Example 1, a printed circuit board having a line width of 100 μm and a fine pattern image excellent in resolution was obtained.

COMPARATIVE EXAMPLE 1

Except for using the protic ammonium salt-containing resin solution of Preparation Example 3 in place of the aprotic sulfonium salt-containing resin solution of Preparation Example 1, preparation of a composition, formation of a cured coating film on a copper-clad laminate, pattern exposure, development, etching and removal of the cured coating film were carried out in the same manner as in the Example 1. Unlike the results of Example 1, a printed circuit board having a line width of about 200 µm and a pattern image deteriorated in resolution was obtained.

What is claimed is:

1. A photosensitive resin composition comprising
  (A) A resin having at least one aprotic onium salt represented by the general formula (1) and the (general formula (2):

—COO⁻·W⁺  (1)

  (2)

wherein W⁺ represents

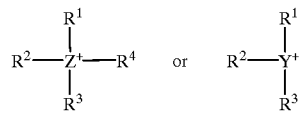

wherein, Z represents a nitrogen atom or phosphorus atom, Y represents a sulfur atom; $R^1$, $R^2$, $R^3$ and $R^4$ are the same or different and each represents an organic group having 1 to 30 carbon atoms: $R^1$ and $R^2$ or $R^1$, $R^2$ and $R^3$ may combine to form a heterocyclic ring together with the nitrogen atom, the phosphorus atom or the sulfur atom to which they are bound; and any one of $R^1$ to $R^4$ may be a group represented by the general formula:

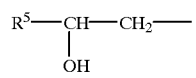
  (3)

wherein $R^5$ is a hydrocarbon group having 1 to 28 carbon atoms which may optionally be substituted by a hydroxyl group, an alkoxy group, an ester group or a halogen atom or a hydrogen atom, (B) a compound having two or more vinylether groups in a molecule, and
  (C) a compound which generates an acid upon irradiation with actinic energy rays, the aprotic onium salt-containing resin (A) being obtainable by introducing the aprotic onium salt to a carboxyl group-containing resin, a hydroxyphenyl group-containing resin or a carboxyl group and hydroxyphenyl group-containing resin by reacting any one of the carboxyl group-containing resin, the hydroxyphenyl group-containing resin or the carboxyl group and hydroxyphenyl group-containing resin with a tertiary amine, phosphine or thioether and an epoxy compound simultaneously, or the aprotic onium salt-containing resin (A) being obtainable by reacting an organic carboxylic acid with a tertiary amine, phosphine or thioether and an epoxy compound simultaneously to give an onium salt consisting of W⁺ cation and a —COO⁻ anion; passing the obtained onium salt through an anion exchange resin to exchange the anion with a hydroxyl anion to give an aprotic onium salt compound represented by the general formula:

HO⁻·W⁺  (5)

wherein W⁺ is as defined above; and mixing the obtained aprotic onium salt compound with a carboxyl group-containing resin, a hydroxyphenyl group-containing resin or a carboxyl group and hydroxyphenyl group-containing resin.

2. The composition according to claim 1, wherein the aprotic onium salt-containing resin (A) contains the aprotic onium salt represented by the general formula (1) and/or the aprotic onium salt represented by the general formula (2) in an amount of 0.1 to 5 mol per 1 kilogram of the resin.

3. The composition according to claim 1, wherein compound (B) is a compound having two or more vinylether groups in a molecule, the groups being represented by the general formula:

—R—O—CH=CH₂  (6)

wherein R represents an alkylene group having 1 to 6 carbon atoms.

4. The composition according to claim 1, which comprises, per 100 parts by weight of the aprotic onium salt-containing resin (A), about 5 to 150 parts by weight of the compound (B) having two or more vinylether groups in a molecule and about 0.1 to 40 parts by weight of the compound (C) which generates an acid upon irradiation with actinic energy rays.

5. The composition according to claim 1, which is in the form of an aqueous resin composition.

6. The composition according to claim 1, which is in the form of an organic solvent-based resin composition.

* * * * *